United States Patent
Yu et al.

(10) Patent No.: US 9,055,689 B2
(45) Date of Patent: Jun. 9, 2015

(54) DOOR MECHANISM AND ELECTRONIC DEVICE THEREWITH

(71) Applicant: Wistron Corporation, New Taipei (TW)

(72) Inventors: Ching-Jen Yu, New Taipei (TW); Bo-Chun Lin, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 28 days.

(21) Appl. No.: 14/074,724

(22) Filed: Nov. 8, 2013

(65) Prior Publication Data

US 2015/0061482 A1 Mar. 5, 2015

(30) Foreign Application Priority Data

Sep. 3, 2013 (TW) .............................. 102216564 U

(51) Int. Cl.
| | |
|---|---|
| *H05K 7/14* | (2006.01) |
| *H05K 5/02* | (2006.01) |
| *G06F 1/18* | (2006.01) |
| *E05D 7/10* | (2006.01) |
| *B65D 43/14* | (2006.01) |
| *B65D 51/04* | (2006.01) |
| *B65D 51/18* | (2006.01) |
| *E05C 1/02* | (2006.01) |
| *E05C 1/04* | (2006.01) |

(52) U.S. Cl.
CPC .............. *H05K 7/1487* (2013.01); *G06F 1/181* (2013.01); *H05K 5/0226* (2013.01)

(58) Field of Classification Search
CPC ....... G06F 1/181; G06F 1/182; H05K 5/0004; H05K 5/0008; H05K 5/0013; H05K 5/0217; H05K 5/0221; H05K 5/0226; H05K 5/0239; H05K 5/03; H05K 7/14; H05K 7/1487; E05D 7/1066; E05D 7/1061; E05D 7/105; E05D 7/06; E05C 1/14; E05C 1/16; E05C 1/04; E05C 1/004; E05C 1/006; E05B 63/0017; E05B 63/0008; E05B 65/02; E05B 65/08; E05B 65/087; B65D 43/20; B65D 43/163; B65D 43/16; B65D 43/14

See application file for complete search history.

(56) References Cited

U.S. PATENT DOCUMENTS

| 2,762,076 | A | * | 9/1956 | Yoneo Kiba ................... 220/844 |
| 5,561,893 | A | * | 10/1996 | Lee ................................... 29/434 |
| 6,074,028 | A | * | 6/2000 | Ho ............................... 312/223.2 |

(Continued)

FOREIGN PATENT DOCUMENTS

CN 201097281 Y * 8/2008 ................. G06F 1/18

*Primary Examiner* — Daniel J Troy
*Assistant Examiner* — Andrew Roersma
(74) *Attorney, Agent, or Firm* — Winston Hsu; Scott Margo

(57) ABSTRACT

A door mechanism includes a cover, a connecting bracket, a rotary door, a sliding bracket and a sliding button. The sliding button is connected to the sliding bracket. When the sliding button is located at a stopping position, the sliding button contacts against the rotary door for constraining the rotary door from moving in a first direction and the sliding button drives the sliding bracket to a position where the sliding bracket is stopped for constraining the rotary door from pivoting relative to the cover. When the sliding button is located at an unlocking position, the sliding button drives the sliding bracket to a position where the sliding bracket is not stopped and the rotary door can move in the first direction, so that the rotary door can pivot relative to the cover to expose a containing space of a housing.

20 Claims, 12 Drawing Sheets

(56) References Cited

U.S. PATENT DOCUMENTS

| | | | |
|---|---|---|---|
| 6,381,145 B1* | 4/2002 | Chen et al. | 361/752 |
| 6,392,874 B1* | 5/2002 | Gan | 361/679.59 |
| 6,469,904 B1* | 10/2002 | Vigeant et al. | 361/752 |
| 6,711,009 B2* | 3/2004 | Lee et al. | 361/679.58 |
| 6,737,577 B1* | 5/2004 | Liao et al. | 174/50 |
| 6,788,542 B2* | 9/2004 | Rumney | 361/724 |
| 7,021,682 B2* | 4/2006 | Erickson et al. | 292/303 |
| 7,180,013 B2* | 2/2007 | Peng et al. | 174/542 |
| 7,277,277 B2* | 10/2007 | Bang | 361/679.55 |
| 7,518,878 B1* | 4/2009 | Liu et al. | 361/726 |
| 7,839,633 B2* | 11/2010 | Chou | 361/679.6 |
| 2006/0103272 A1* | 5/2006 | Chen et al. | 312/223.2 |
| 2006/0234545 A1* | 10/2006 | Shi et al. | 439/521 |
| 2009/0290322 A1* | 11/2009 | Chang | 361/837 |
| 2010/0007252 A1* | 1/2010 | Liu | 312/223.2 |
| 2010/0026149 A1* | 2/2010 | Zhang et al. | 312/223.2 |
| 2012/0169197 A1* | 7/2012 | Jiang | 312/293.3 |

* cited by examiner

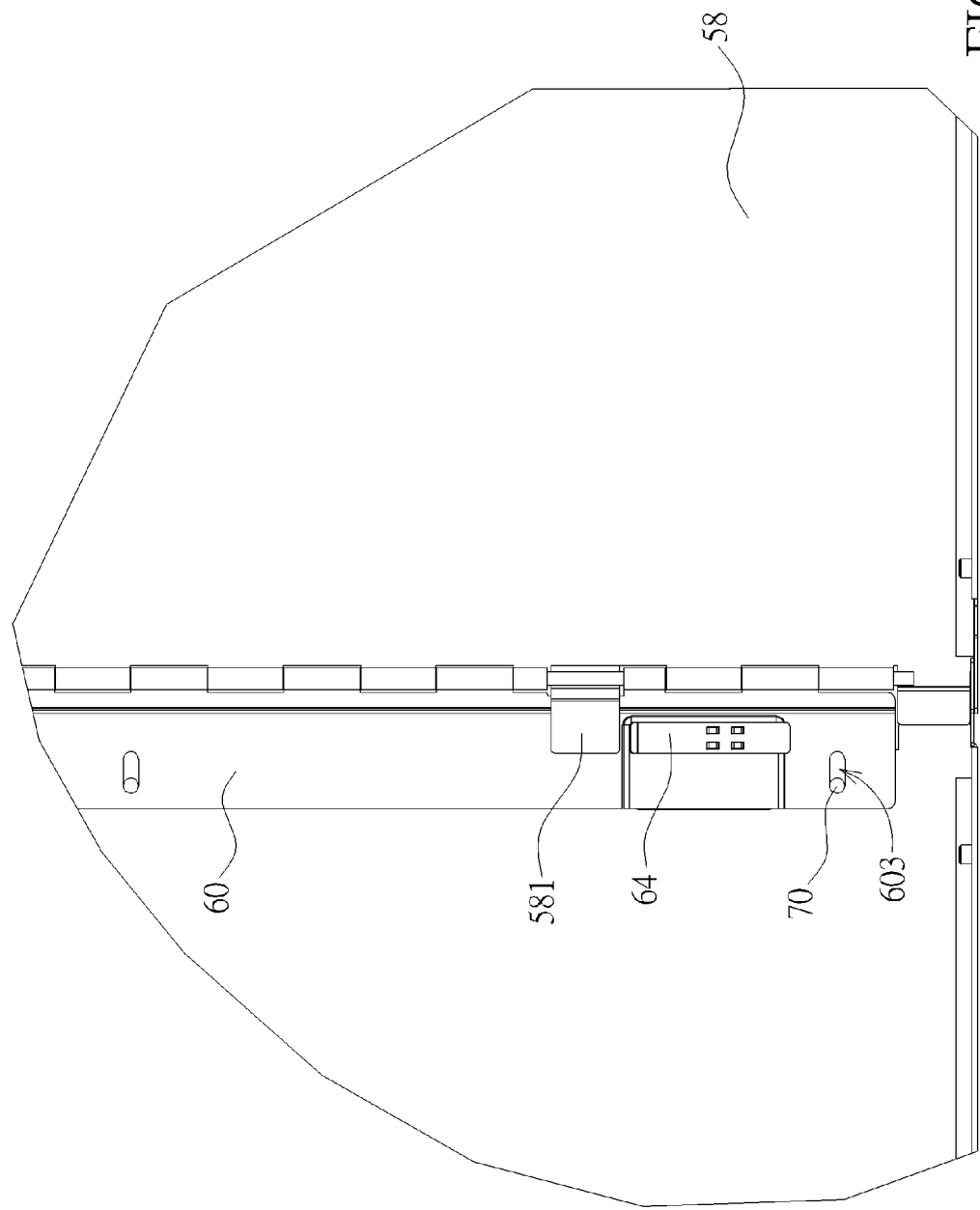

DOOR MECHANISM AND ELECTRONIC DEVICE THEREWITH

BACKGROUND OF THE INVENTION

1. Field of the Invention

The present invention relates to a door mechanism, and more especially, to a door mechanism capable of sliding and pivoting for fastening a cover and an electronic device therewith.

2. Description of the Prior Art

With the growing of the computer industry and the internet, computer servers are widely applied incorporations and organizations, and especially there is larger numbers of computer severs applied in large internet service providers. A conventional door mechanism is disposed on a housing of a server for dustproof and replacing internal electronic components more conveniently. The door mechanism is for shielding the internal electronic components as it is covered on the housing, and the internal electronic components can be replaced as the door mechanism is opened. The conventional door mechanism is usually pivoted to be opened or closed, and the conventional door mechanism can be fixed on the housing of the server by a hook as the conventional door mechanism is closed. However, the conventional door mechanism is easy to be unhooked as being fixed by the hook when transporting or using the server, so that external dust may get into the server and the internal electronic components may drop, and it results in inconvenience in operation and the internal electronic components may easily be broken. Therefore, it is a significant issue to design a door mechanism on the server which cannot be unhooked easily and can be operated conveniently.

SUMMARY OF THE INVENTION

The present invention relates to a door mechanism, and more especially, to a door mechanism capable of sliding and pivoting for fastening a cover and an electronic device therewith for solving the above drawbacks.

According to the disclosure, a door mechanism includes a cover, a connecting bracket, a rotary door, a sliding bracket and a sliding button. The cover includes a stopping portion for covering the containing space in a housing. The connecting bracket is pivoted to the cover, and a sliding track is formed on the connecting bracket. A rotary door is combined with the connecting bracket, and a concave portion is formed on the rotary door. The sliding bracket is installed on a side of the connecting bracket. The sliding button is slidably passing through the sliding track and disposed on another side of the connecting bracket, the sliding button is connected to the sliding bracket, and the sliding button contacts against the rotary door so as to constrain the rotary door from moving in a first direction when the sliding button is located at a stopping position. When the sliding button is located at an unlocking position, the sliding button drives the sliding bracket to a position where the sliding bracket is not stopped by the stopping portion, and the rotary door is capable of moving in the first direction for engaging the concave portion with the sliding button, so that the rotary door pivots in a first pivoting direction relative to the cover to partially expose the containing space.

According to the disclosure, an L-shaped slot is formed on a side of the housing, a rotary constraining unit is disposed on a side of the rotary door and movably installed inside the L-shaped slot, and the rotary door slides in a second direction opposite to the first direction relative to the connecting bracket, so that the rotary constraining unit contacts against an end portion of the L-shaped slot for constraining the rotary door from pivoting relative to the cover. When the sliding button is located at the unlocking position, the rotary constraining unit moves in the first direction for engaging the concave portion with the sliding button, so that the rotary constraining unit moves to a corner portion of the L-shaped slot and the rotary door is capable of pivoting relative to the cover.

According to the disclosure, a protruding portion is formed on a side of the rotary door far away from the cover and for inserting into a groove on the housing, so as to constrain the rotary door from pivoting relative to the cover, as the rotary door sides relative to the connecting bracket in the second direction.

According to the disclosure, a guiding slot is formed on the connecting bracket, the door mechanism further includes a pin, an end of the pin is fixed on the rotary door and slidably disposed in the guiding slot, and the guiding slot is for guiding the pin to move in the first direction.

According to the disclosure, a plurality of first hemmed edges is spaced on a side of the cover facing to the connecting bracket, a plurality of second hemmed edges is spaced on a side of the connecting bracket facing to the cover, the plurality of first hemmed edges and the plurality of second hemmed edges are arranged alternately, and the door mechanism further includes a shaft passing through a side opening and inserted into the plurality of first hemmed edges and the plurality of second hemmed edges so that the rotary door pivots relative to the cover via the shaft.

According to the disclosure, a side protruding portion is disposed on each of two sides of the rotary door, and the side protruding portion covers the shaft and the corresponding side opening as the rotary door pivots relative to the cover.

According to the disclosure, the cover includes a rotary stopping portion for constraining the rotary door from rotating in a second pivoting direction opposite to the first pivoting direction.

According to the disclosure, the sliding button further includes a wall for contacting against the rotary door so as to constrain the rotary door from moving in the first direction when the sliding button is located at the stopping position.

According to the disclosure, a guiding inclined surface is formed on an end of the sliding bracket for guiding the sliding bracket to engage with the stopping portion.

According to the disclosure, at least one protrusion is formed on the sliding track of the connecting bracket for pushing the sliding button as the sliding button slides in the sliding track.

According to the disclosure, an electronic device includes a housing, at least one electronic component and a door mechanism. A containing space is formed in the housing, the at least one electronic component is installed inside the containing space of the housing, and the door mechanism is for shielding the at least one electronic component. The door mechanism includes a cover, a connecting bracket, a rotary door, a sliding bracket and a sliding button. The cover includes a stopping portion for covering the containing space in a housing. The connecting bracket is pivoted to the cover, and a sliding track is formed on the connecting bracket. A rotary door is combined with the connecting bracket, and a concave portion is formed on the rotary door. The sliding bracket is installed on a side of the connecting bracket. The sliding button is slidably passing through the sliding track and disposed on another side of the connecting bracket, the sliding button is connected to the sliding bracket, and the sliding button contacts against the rotary door and for constraining the rotary door from moving in a first direction when the sliding button is located at a stopping position. When the sliding button is located at an unlocking position, the sliding button drives the sliding bracket to a position where the sliding bracket is not stopped by the stopping portion, and the rotary door is capable of moving in the first direction for engaging the concave portion with the sliding button, so that the rotary door pivots in a first pivoting direction relative to the cover to partially expose the containing space.

In the present invention, as the door mechanism is locked on the housing, a plurality of constraining structures, such as the sliding button, the protruding portion, the rotary constraining unit and the connecting bracket, corporately constrain the door mechanism from moving and pivoting relative to the housing, so that the door mechanism is not unlocked easily during transporting and in operation. The plurality of constraining structures can selectively include the protruding portion, the rotary constraining unit, the connecting bracket or the combination of them, and it depends on the practical design demand. In addition, according to the present invention, a single sliding button is utilized for controlling the sliding motion and the pivoting motion of the door mechanism relative to the housing simultaneously, which has an advantage in convenient operation. The present invention can solve the conventional problem that the conventional door mechanism is easy to be unhooked as being fixed by the hook when transporting or using the server, so that external dust may get into the server and the internal electronic components may drop, resulting in inconvenience in operation and that the internal electronic components may easily be broken These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 11 and FIG. 12 are diagrams of the sliding bracket moving in different positions relative to the stopping portion according to the embodiment of the present invention.

DETAILED DESCRIPTION

Figure 1:
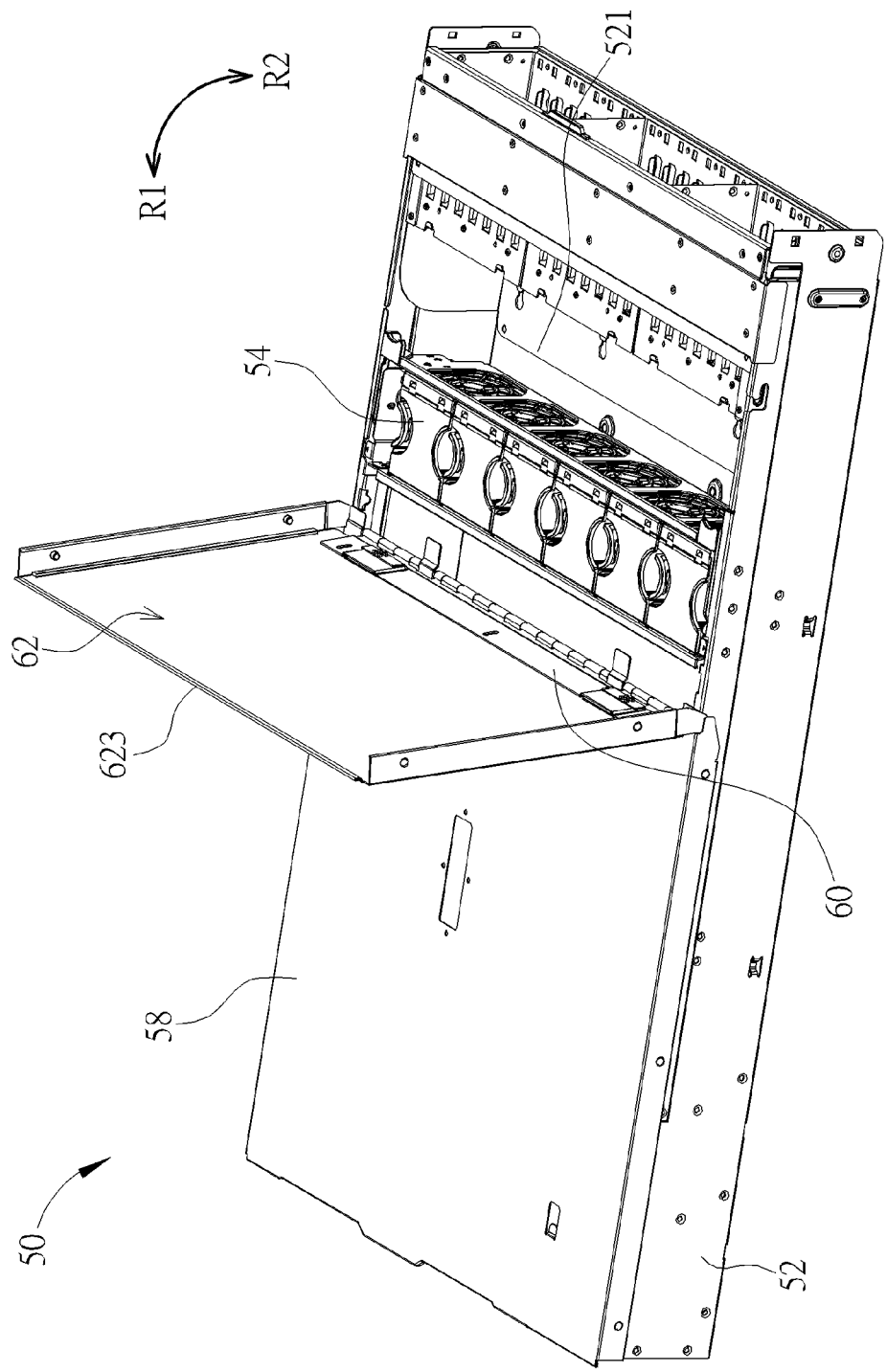
FIG. 1 is a schematic drawing of an electronic device according to an embodiment of the present invention.
Figure 2:
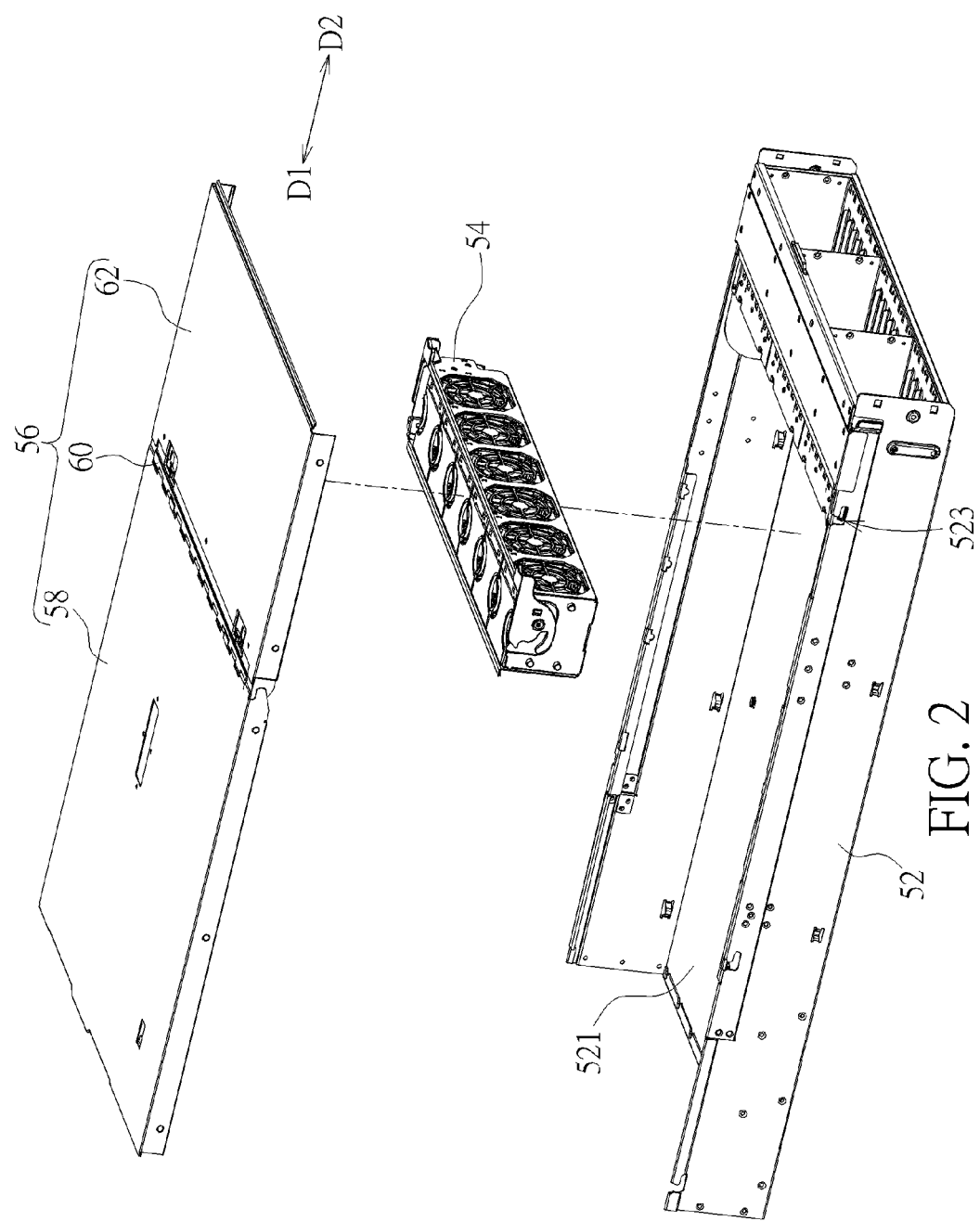
FIG. 2 is an exploded diagram of the electronic device according to the embodiment of the present invention.
Figure 3:
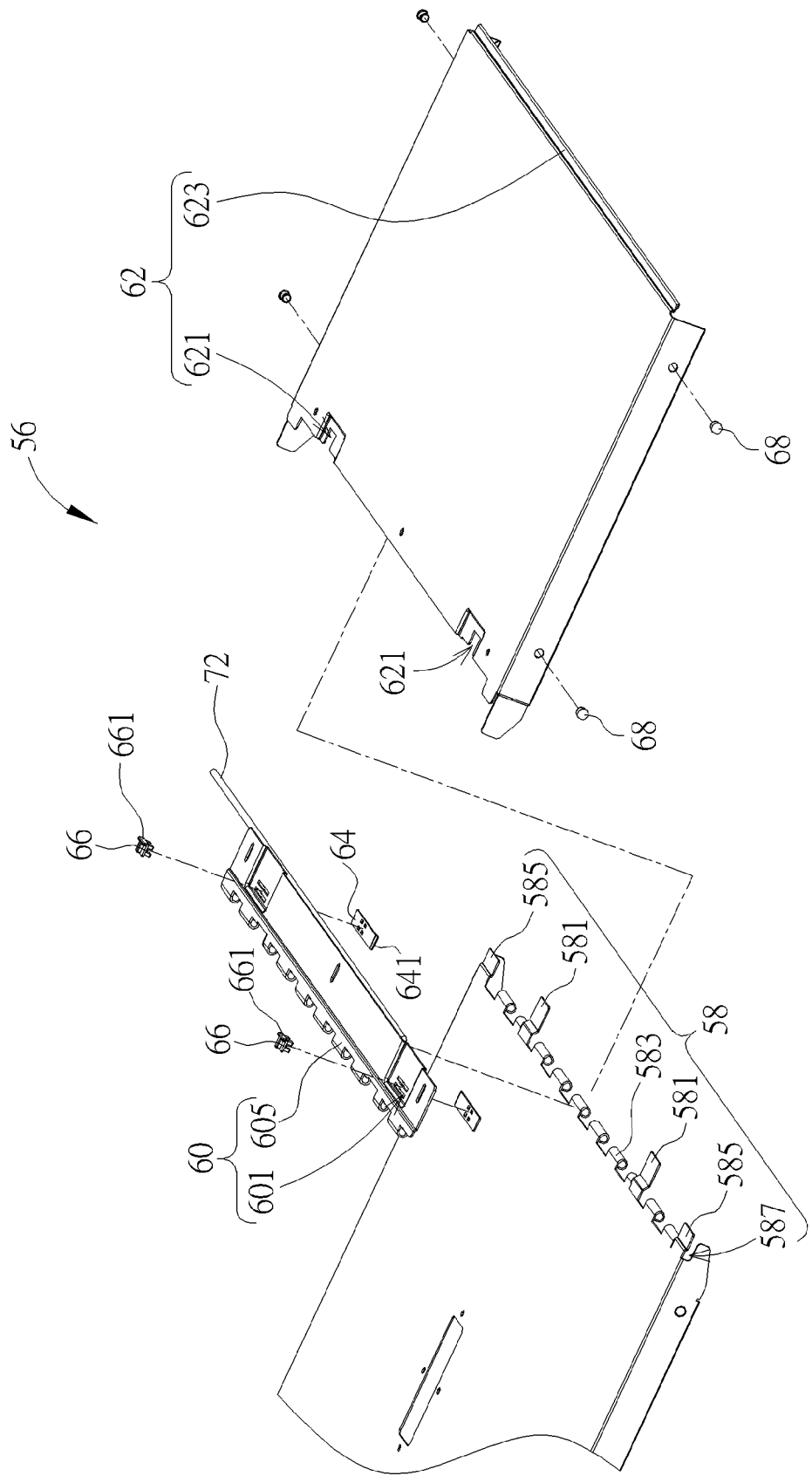
FIG. 3 is an exploded diagram of a door mechanism according to the embodiment of the present invention.

Please refer to FIG. 1 to FIG. 3. FIG. 1 is a schematic drawing of an electronic device 50 according to an embodiment of the present invention. FIG. 2 is an exploded diagram of the electronic device 50 according to the embodiment of the present invention. FIG. 3 is an exploded diagram of a door mechanism 56 according to the embodiment of the present invention. The electronic device 50 includes a housing 52, at least one electronic component 54 and the door mechanism 56. A containing space 521 is formed in the housing 52. The at least one electronic component 54 is installed inside the containing space 521 of the housing 52, and the at least one electronic component 54 can be a fan module, a hard disk module, a memory stick, and so on. The door mechanism 56 is for shielding the at least one electronic component 54, as shown in FIG. 3. The door mechanism 56 includes a cover 58, a connecting bracket 60, a rotary door 62, a sliding bracket 64 and a sliding button 66. The cover 58 is for covering the containing space 521 in the housing 52, and the cover 58 includes a stopping portion 581. The connecting bracket 60 is pivoted to the cover 58, and a sliding track 601 is formed on the connecting bracket 60. The rotary door 62 is combined with the connecting bracket 60, and a concave portion 621 is formed on the rotary door 62. The sliding bracket 64 is installed on a side of the connecting bracket 60, a guiding inclined surface 641 is formed on an end of the sliding bracket 60 for guiding the sliding bracket 64 to engage with the stopping portion 581. The sliding button 66 is slidably passing through the sliding track 601 and disposed on another side of the connecting bracket 60, and the sliding button 66 is connected to the sliding bracket 64.

Figure 4A:
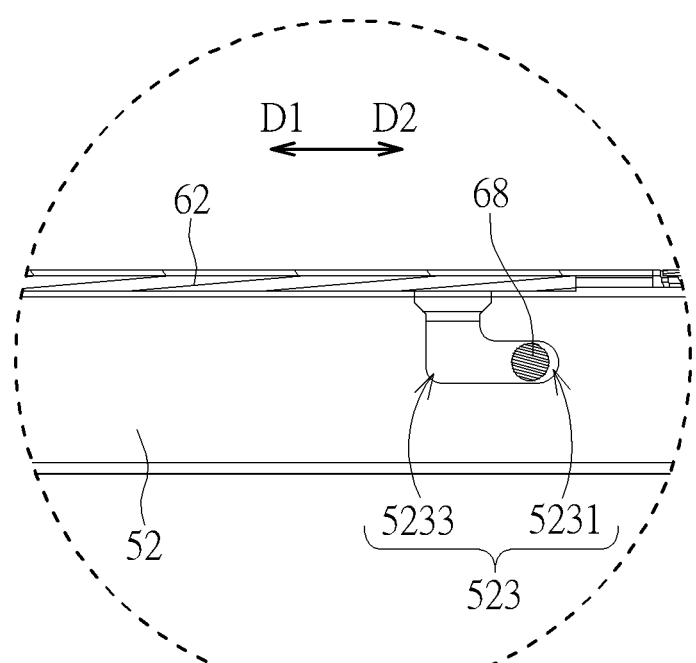
FIG. 4A is a diagram of a rotary constraining unit contacting against an end portion of an L-shaped slot according to the embodiment of the present invention.
Figure 4B:
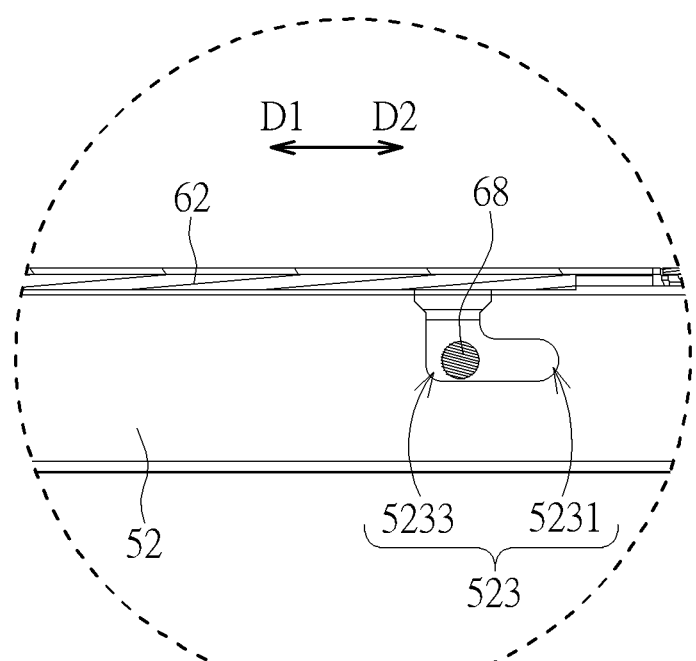
FIG. 4B is a diagram of the rotary constraining unit moving to a corner portion of the L-shaped slot according to the embodiment of the present invention.

Please refer to FIG. 3, FIG. 4A and FIG. 4B. FIG. 4A is a diagram of a rotary constraining unit 68 contacting against an end portion 5231 of an L-shaped slot 523 according to the embodiment of the present invention. FIG. 4B is a diagram of the rotary constraining unit 68 moving to a corner portion 5233 of the L-shaped slot 523 according to the embodiment of the present invention. The L-shaped slot 523 is formed on at least one side of the housing 52, the rotary constraining unit 68 is disposed on at least one side of the rotary door 62 and movably installed inside the L-shaped slot 523. The rotary door 62 can slide in a first direction D1 or a second direction D2 opposite to the first direction D1 relative to the connecting bracket 60. As the rotary door 62 slides in the second direction D2, the rotary constraining unit 68 contacts against the end portion 5231 of the L-shaped slot 523 for constraining the rotary door 62 from pivoting relative to the cover 58. When the sliding button 66 slides to be located at an unlocking position relative to the connecting bracket 60, the rotary constraining unit 68 can move in the first direction D1 for engaging the concave portion 621 with the sliding button 66, so that the rotary constraining unit 68 moves to the corner portion 5233 of the L-shaped slot 523 and the rotary door 62 is capable of pivoting relative to the cover 58. According to this embodiment, the two L-shaped slots 523 are formed on two opposite lateral sides of the housing 52 respectively, and the two rotary constraining units 68 are respectively disposed on two opposite lateral sides of the rotary door 62 correspondingly. The rotary constraining units 68 can be pins, but not limited to this.

Figure 5A:
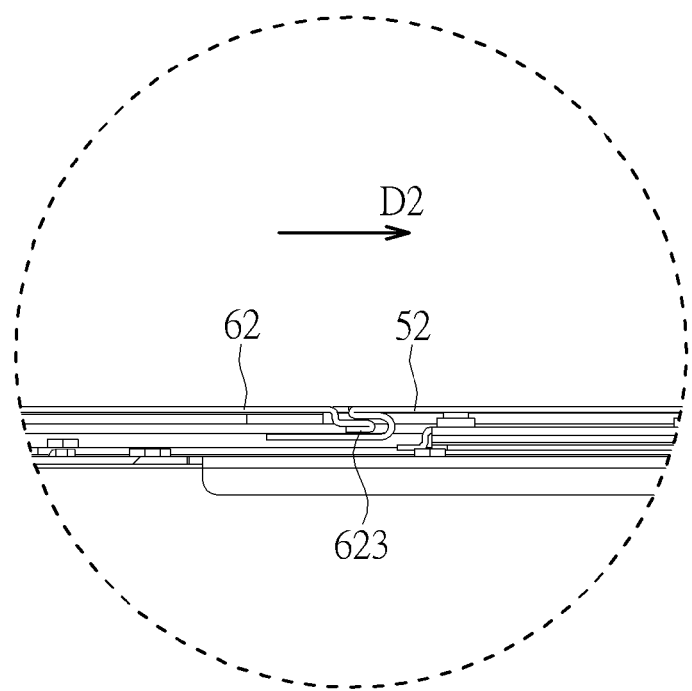
FIG. 5A is a partial cross-sectional diagram of the rotary door being locked on the housing according to the embodiment of the present invention.
Figure 5B:
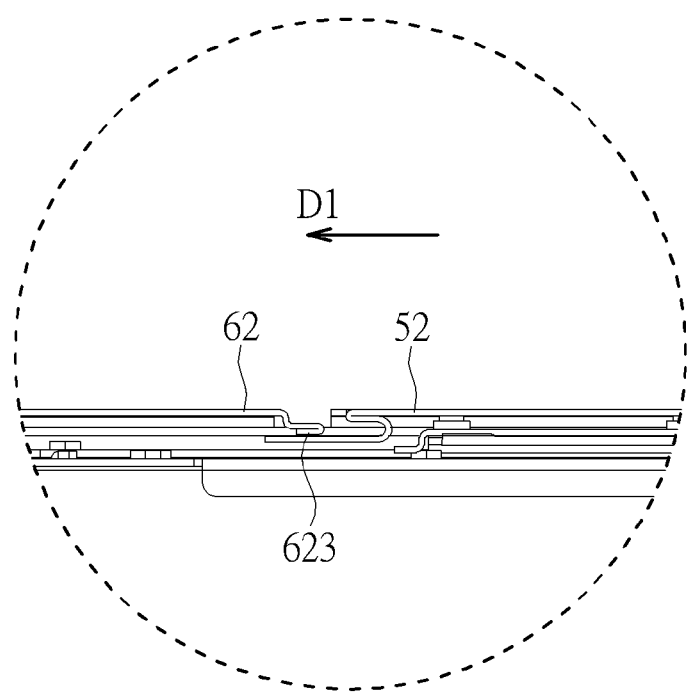
FIG. 5B is a partial cross-sectional diagram of the rotary door being unlocked on the housing according to the embodiment of the present invention.

Please refer to FIG. 3, FIG. 5A and FIG. 5B. FIG. 5A is a partial cross-sectional diagram of the rotary door 62 being locked on the housing 52 according to the embodiment of the present invention. FIG. 5B is a partial cross-sectional diagram of the rotary door 62 being unlocked on the housing 52 according to the embodiment of the present invention. When locking the rotary door 62, besides that the rotary constraining unit 68 contacts against the end portion 5231 of the L-shaped slot 523 for constraining the rotary door 62 from pivoting relative to the cover 58, a protruding portion 623 can be formed on a side of the rotary door 62 far away from the cover 58 so as to constrain the rotary door 62 from pivoting relative to the cover 58 as the rotary door 62 slides relative to the connecting bracket 60 in the second direction D2 and the protruding portion 623 is inserted into a groove on the housing 52. When unlocking the rotary door 62, the rotary door 62 slides in the first direction D1 relative to the connecting bracket 60 to detach the protruding portion 623 from the groove on the housing 52 so as to unlock the rotary door 62.

Figure 6:
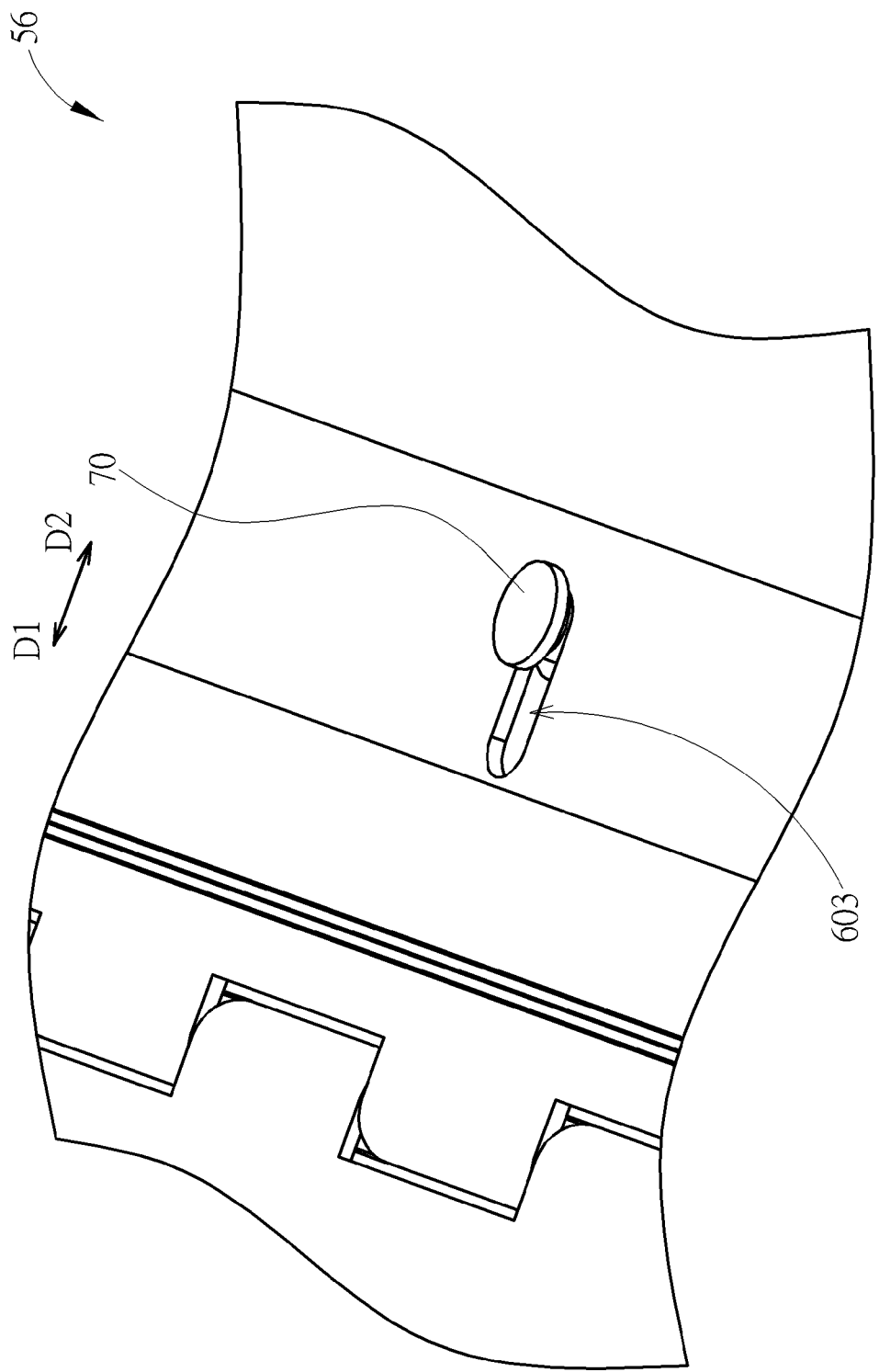
FIG. 6 is a partial structural diagram of the door mechanism according to the embodiment of the present invention.
Figure 7:
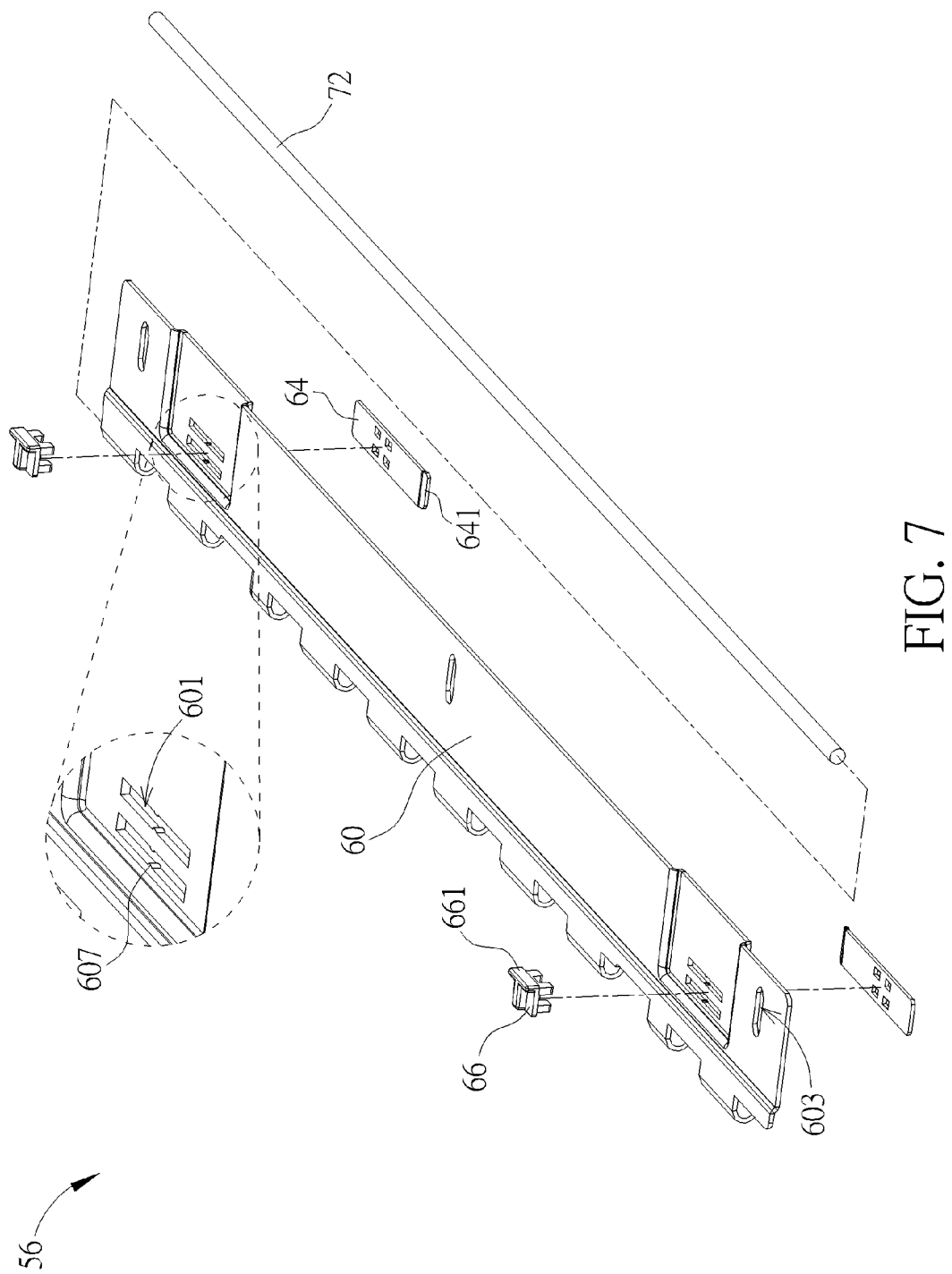
FIG. 7 is an exploded diagram of the connecting bracket, the sliding bracket and the sliding button according to the embodiment of the present invention.

Please refer to FIG. 3, FIG. 6 and FIG. 7. FIG. 6 is a partial structural diagram of the door mechanism 56 according to the embodiment of the present invention. FIG. 7 is an exploded diagram of the connecting bracket 60, the sliding bracket 64 and the sliding button 66 according to the embodiment of the present invention. A guiding slot 603 is formed on the connecting bracket 60. The door mechanism 56 further includes a pin 70, and an end of the pin 70 is fixed on the rotary door 62 and slidably disposed in the guiding slot 603, and the guiding slot 603 is for guiding the pin 70 to move in the first direction D1 or the second direction D2. The pin 70 can be preferably formed in a T shape. According to the embodiment, three pins 70 are disposed on the rotary door 62, and three guiding slot 603 are formed on the connecting bracket 60 correspondingly. In addition, at least one protrusion 607 is formed on the sliding track 601 of the connecting bracket 60 for pushing the sliding button 66 as the sliding button 66 slides in the sliding track 601. The protrusion 607 is for generating click feeling so that a user knows that the sliding button 66 has been correctly moved to a stopping position or an unlocking position so as to operate the sliding button 66 more conveniently. The sliding button 66 further includes a wall 661 for contacting against the rotary door 62 so as to constrain the rotary door 62 from moving in the first direction D1 when the sliding button 66 slides to be located at the stopping position relative to the connecting bracket 60.

Figure 8:
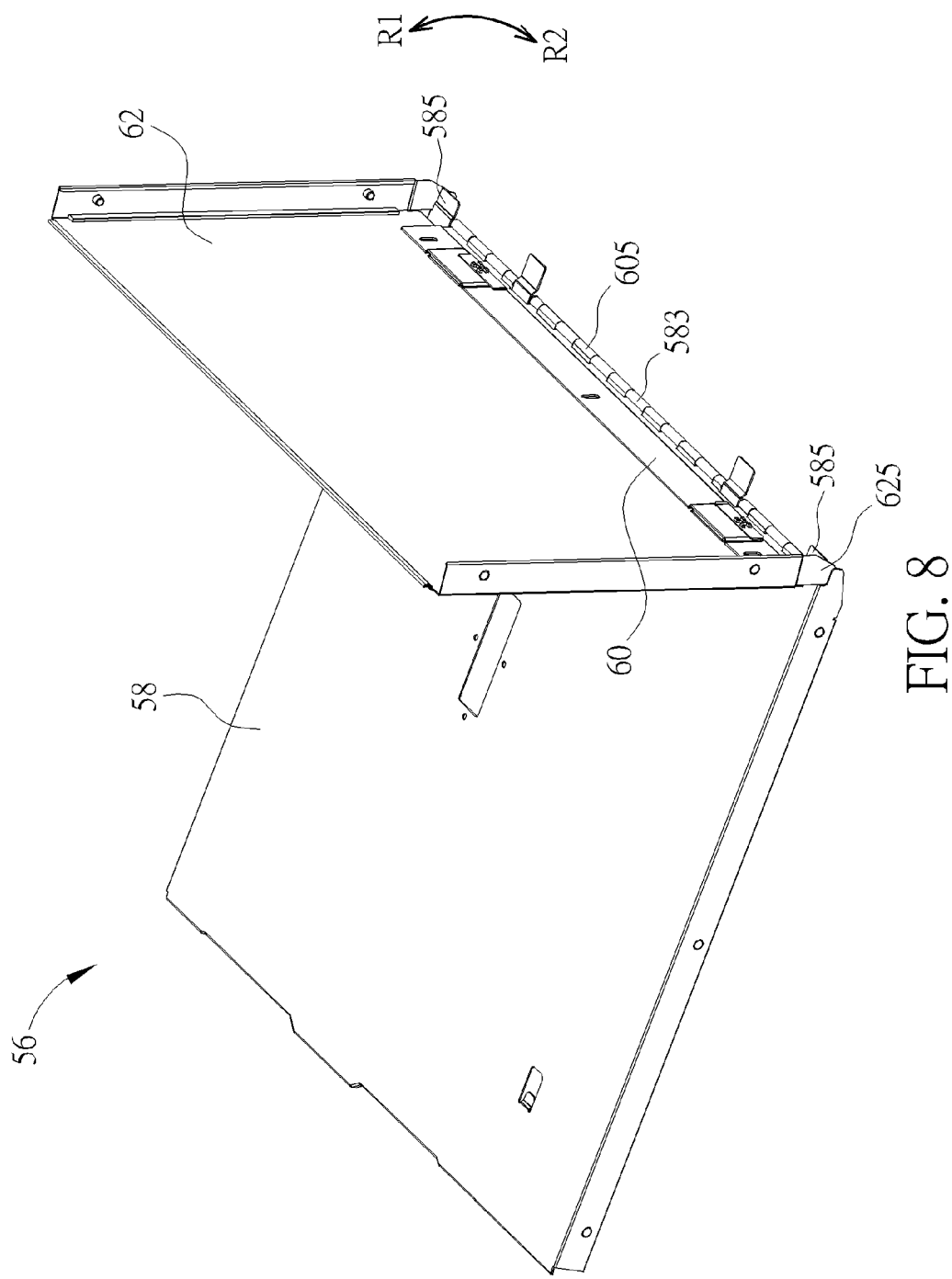
FIG. 8 is a diagram of the rotary rotating in a first rotating direction R1 according to the embodiment of the present invention.

Please refer to FIG. 3, FIG. 7 and FIG. 8. FIG. 8 is a diagram of the rotary door 62 rotating in a first rotating direction R1 according to the embodiment of the present invention. A plurality of first hemmed edges 583 is spaced on a side of the cover 58 facing to the connecting bracket 60, and a plurality of second hemmed edges 605 is spaced on a side of the connecting bracket 60 facing to the cover 58. The plurality of first hemmed edges 583 and the plurality of second hemmed edges 605 are arranged alternately as combining the connecting bracket 60 with the cover 58. The door mechanism 56 further includes a shaft 72 passing through a side opening 587 and inserted into the plurality of first hemmed edges 583 and the plurality of second hemmed edges 605, so that the connecting bracket 60 and the rotary door 62 can pivot relative to the cover 58 via the shaft 72. In addition, a side protruding portion 625 is disposed on each of two sides of the rotary door 62, the side protruding portion 625 covers the shaft 72 and the corresponding side opening 587 as the rotary door 62 pivots relative to the cover 58 for keeping aesthetic appearance and for preventing hands form being pinched as the rotary door 62 pivots relative to the cover 58 in operation. The cover 58 includes a rotary stopping portion 585 for contacting against the rotary door 62 and for constraining a rotary angle of the rotary door 62 as the rotary door 62 is rotating in a second pivoting direction R2 opposite to the first pivoting direction R1.

Figure 9:
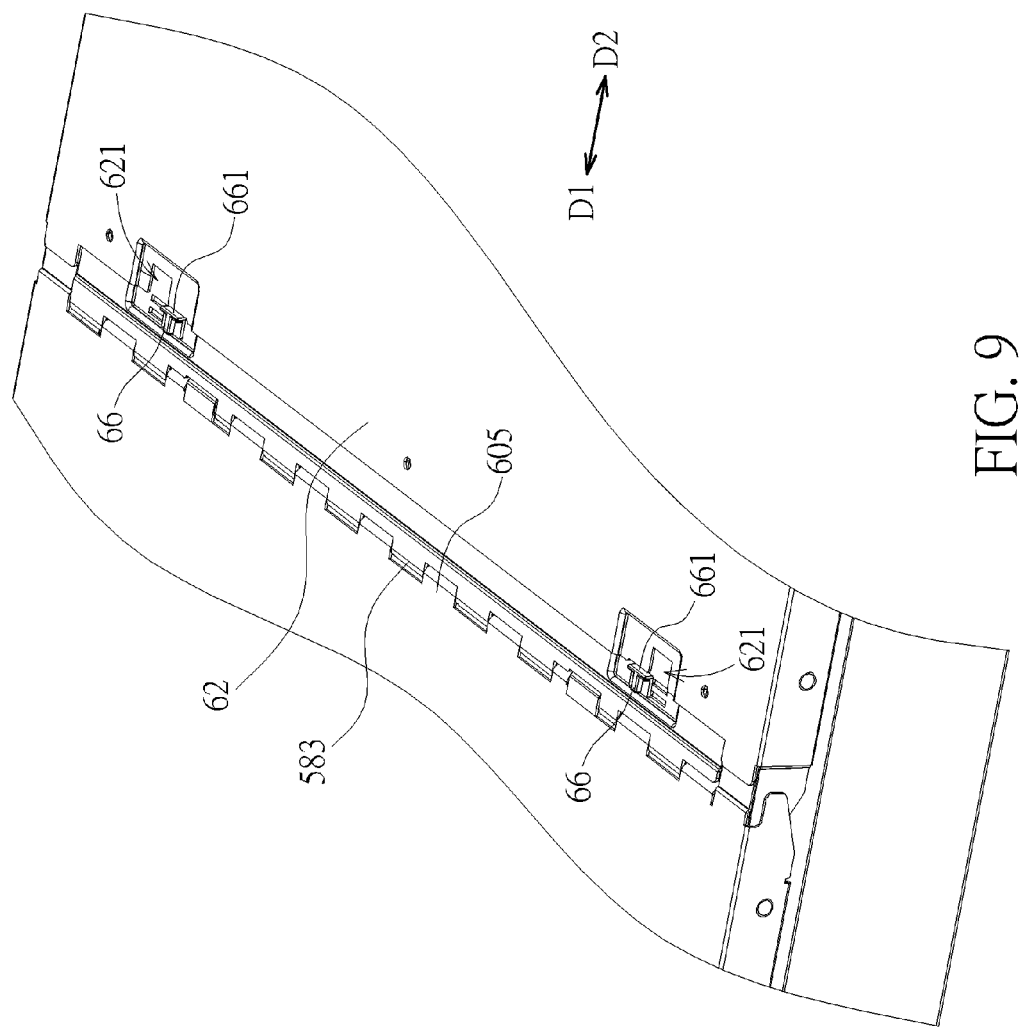
FIG. 9 and FIG. 10 are diagrams of the sliding button sliding to be located at the stopping position and the unlocking position relative to the connecting bracket according to the embodiment of the present invention.
Figure 10:
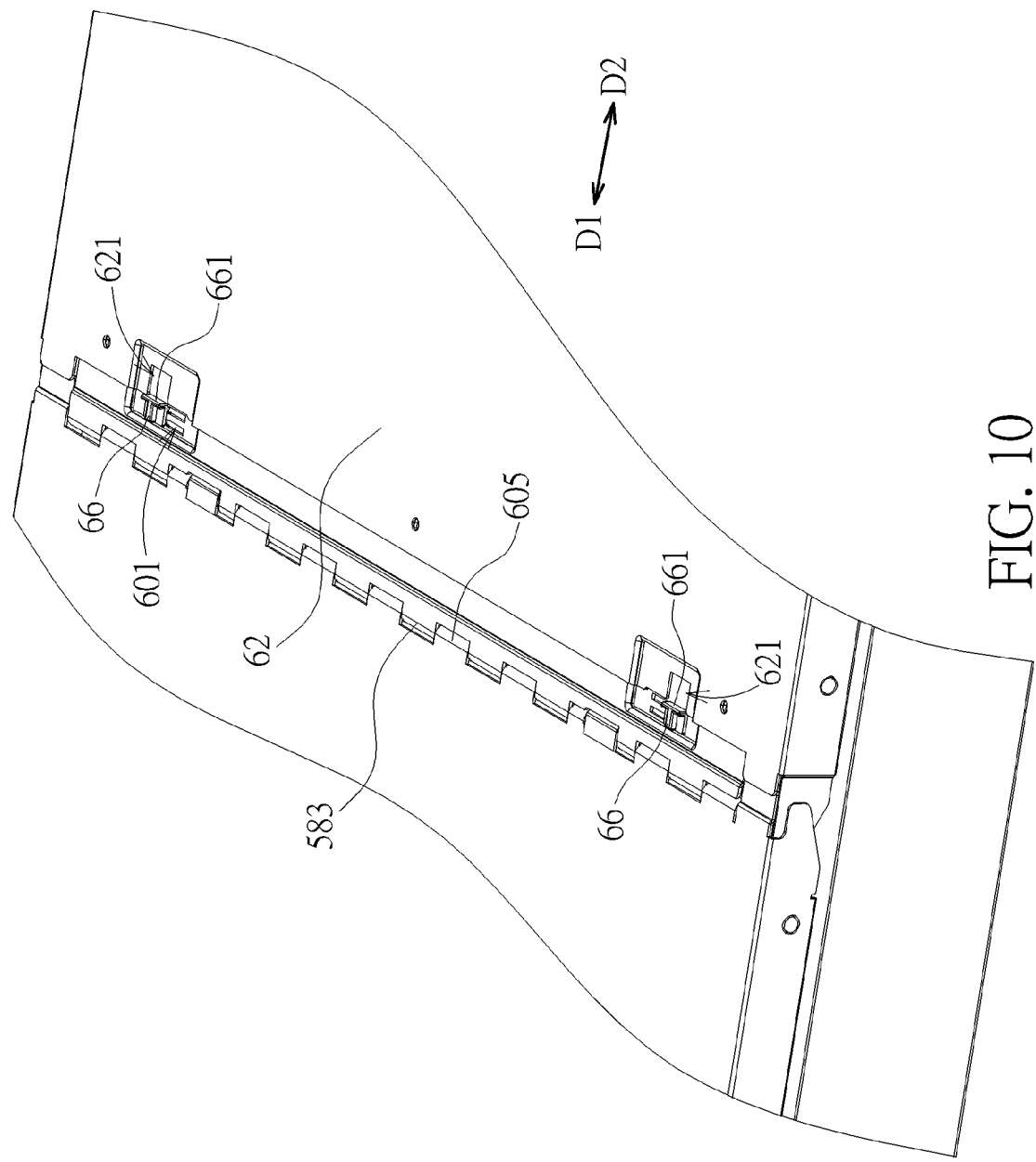
Figure 11:
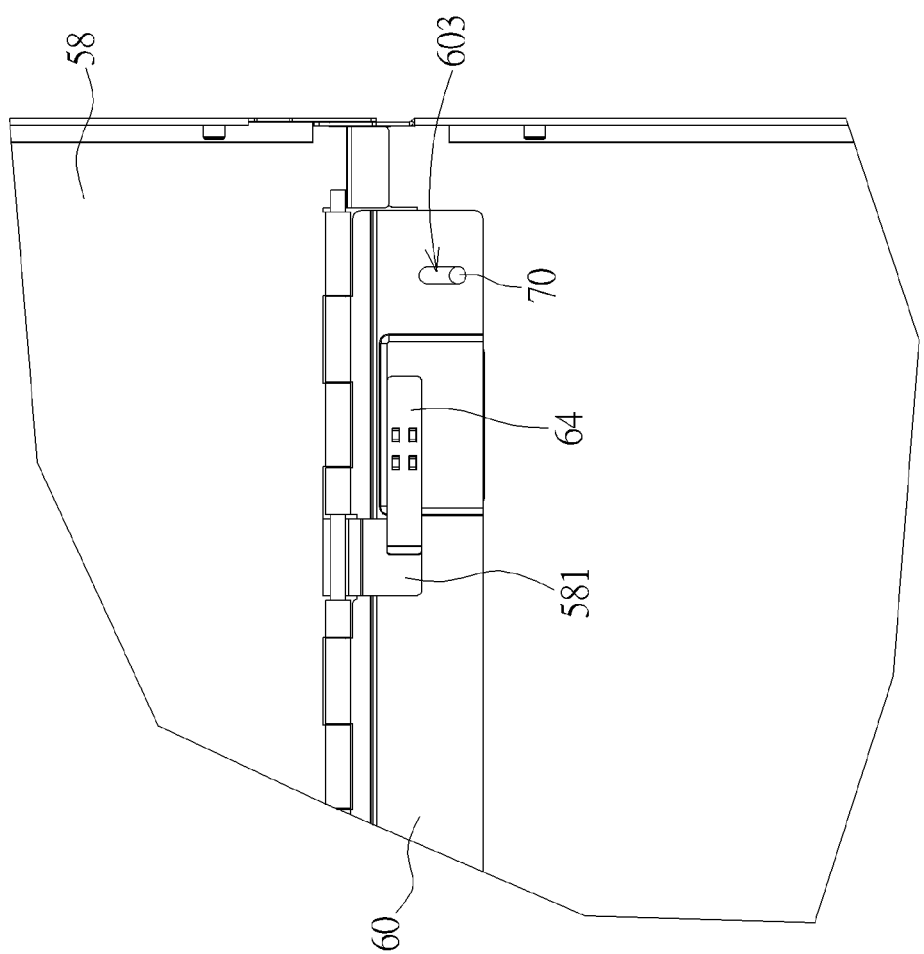

Please refer to FIG. 1, FIG. 4A to FIG. 6 and FIG. 8 to FIG. 12. FIG. 9 and FIG. 10 are diagrams of the sliding button 66 sliding to be located at the stopping position and the unlocking position relative to the connecting bracket 60 according to the embodiment of the present invention. FIG. 11 and FIG. 12 are diagrams of the sliding bracket 64 moving in different positions relative to the stopping portion 581 according to the embodiment of the present invention. The operation of locking and unlocking the rotary door 62 is introduced in detail as follows according to the embodiment of the present invention.

Please refer to FIG. 1, FIG. 4A, FIG. 5A, FIG. 6, FIG. 8, FIG. 9 and FIG. 11. As locking the rotary door 62, the rotary door 62 and the connecting bracket 60 pivot in the second pivoting direction R2 relative to the cover 58 first until the rotary door 62 contacts against the rotary stopping portion 585. Then the rotary door 62 can slide in the second direction D2 relative to the connecting bracket 60, and the pin 70 moves along the guiding slot 603 relative to the connecting bracket 60 so as to contact against an extreme position of an end of the guiding slot 603 far away from the cover 58. Meanwhile, the rotary constraining unit 68 contacts against the end portion 5231 of the L-shaped slot 523, and the protruding portion 623 is inserted into the groove on the housing 52 so as to constrain the rotary door 62 from pivoting relative to the cover 58. As shown in FIG. 9, the sliding button 66 slides to be located at the stopping position along the sliding track 601 relative to the connecting bracket 60, meanwhile the wall 661 of the sliding button 66 contacts against the rotary door 62 for constraining the rotary door 62 form moving in the first direction D1. As shown in FIG. 11, the button 66 drives the sliding bracket 64 to a position where the sliding bracket 64 is stopped by the stopping portion 581 for constraining the rotary door 62 from pivoting relative to the cover 58.

Please refer to FIG. 1, FIG. 4B, FIG. 5B, FIG. 6B, FIG. 8, FIG. 10 and FIG. 12. As unlocking the rotary door 62, the sliding button 66 slides to be located at the unlocking position along the sliding track 601 relative to the connecting bracket 60, as shown in FIG. 10. As shown in FIG. 12, the sliding button 66 drives the sliding bracket 64 to a position where the sliding bracket 64 is not stopped by the stopping portion 581, and then the rotary door 62 can move in the first direction D1 so that the concave portion 621 engages with the sliding button 66. Meanwhile, the pin 70 moves along the guiding slot 603 relative to the connecting bracket 60 so as to contact against an extreme position of the other end of the guiding slot 603 close to the cover 58. At the same time, the rotary constraining unit 68 moves to the corner portion 5233 of the L-shaped slot 523, and the protruding portion 623 separates from the groove of the housing so that the rotary door 62 is able to pivot in the first pivoting direction R1 relative to the cover 58, so as to partially expose the containing space 521 for replacing the internal electronic component 54.

In contrast to the prior art, as the door mechanism is locked on the housing of the present invention, a plurality of constraining structures, such as the sliding button, the protruding portion, the rotary constraining unit and the connecting bracket, corporately constrain the door mechanism from moving and pivoting relative to the housing, so that the door mechanism is not unlocked easily during transporting and in operation. The plurality of constraining structures can selectively include the protruding portion, the rotary constraining unit, the connecting bracket or the combination of them, and it depends on the practical design demand. In addition, according to the present invention, a single sliding button is utilized for controlling the sliding motion and the pivoting motion of the door mechanism relative to the housing simultaneously, which has an advantage in convenient operation. The present invention can solve the conventional problem that the conventional door mechanism is easy to be unhooked as being fixed by the hook when transporting or using the server, so that external dust may get into the server and the internal electronic components may drop, resulting in inconvenience in operation and that the internal electronic components may easily be broken.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A door mechanism comprising:
   a cover comprising a stopping portion, the cover covering a containing space in a housing;
   a connecting bracket pivoted to the cover, a sliding track being formed on the connecting bracket;
   a rotary door combined with the connecting bracket, a concave portion being formed on the rotary door;
   a sliding bracket installed on a side of the connecting bracket; and
   a sliding button slidably passing through the sliding track and disposed on another side of the connecting bracket, the sliding button being connected to the sliding bracket, when the sliding button is located at a stopping position, the sliding button contacting against the rotary door for constraining the rotary door from sliding relative to the cover in a first direction and the sliding button driving the sliding bracket to a position where the sliding bracket is stopped by the stopping portion for constraining the rotary door from pivoting relative to the cover, and when the sliding button is located at an unlocking position, the sliding button driving the sliding bracket to a position where the sliding bracket is not stopped by the stopping portion, and the rotary door is capable of sliding relative to the cover in the first direction for engaging the concave portion with the sliding button, so that the rotary door pivots in a first pivoting direction relative to the cover to partially expose the containing space, the cover being detachable from the housing by sliding in the first direction, and the cover and the rotary door being substantially co-planar when covering the containing space.

2. The door mechanism of claim 1, wherein an L-shaped slot is formed on a side of the housing, a rotary constraining unit is disposed on a side of the rotary door and movably installed inside the L-shaped slot, the rotary door slides in a second direction opposite to the first direction relative to the connecting bracket, so that the rotary constraining unit contacts against an end portion of the L-shaped slot for constraining the rotary door from pivoting relative to the cover, and when the sliding button is located at the unlocking position, the rotary constraining unit moves in the first direction for engaging the concave portion with the sliding button, so that the rotary constraining unit moves to a corner portion of the L-shaped slot and the rotary door is capable of pivoting relative to the cover.

3. The door mechanism of claim 1, wherein a protruding portion is formed on a side of the rotary door far away from the cover and for inserting into a groove on the housing, so as to constrain the rotary door from pivoting relative to the cover, as the rotary door sides relative to the connecting bracket in a second direction.

4. The door mechanism of claim 1, wherein a guiding slot is formed on the connecting bracket, the door mechanism further comprises a pin, and an end of the pin is fixed on the rotary door and slidably disposed in the guiding slot, and the guiding slot is for guiding the pin to move in the first direction.

5. The door mechanism of claim 1, wherein a plurality of first hemmed edges is spaced on a side of the cover facing to the connecting bracket, a plurality of second hemmed edges is spaced on a side of the connecting bracket facing to the cover, the plurality of first hemmed edges and the plurality of second hemmed edges are arranged alternately, and the door mechanism further comprising a shaft passing through a side opening and inserted into the plurality of first hemmed edges and the plurality of second hemmed edges, so that the rotary door pivots relative to the cover via the shaft.

6. The door mechanism of claim 5, wherein a side protruding portion is disposed on each of two sides of the rotary door, the side protruding portion covers the shaft and the corresponding side opening as the rotary door pivots relative to the cover.

7. The door mechanism of claim 1, wherein the cover comprises a rotary stopping portion for constraining the rotary door from rotating in a second pivoting direction opposite to the first pivoting direction.

8. The door mechanism of claim 1, wherein the sliding button further comprises a wall for contacting against the rotary door so as to constrain the rotary door from moving in the first direction, when the sliding button is located at the stopping position.

9. The door mechanism of claim 1, wherein a guiding inclined surface is formed on an end of the sliding bracket for guiding the sliding bracket to engage with the stopping portion.

10. The door mechanism of claim 1, wherein at least one protrusion is formed on the sliding track of the connecting bracket for pushing the sliding button as the sliding button slides in the sliding track.

11. An electronic device comprising:
    a housing, a containing space being formed in the housing;
    at least one electronic component installed inside the containing space of the housing; and
    a door mechanism for shielding the at least one electronic component, the door mechanism comprising:
    a cover comprising a stopping portion for covering the containing space in the housing;
    a connecting bracket pivoted to the cover, a sliding track being formed on the connecting bracket;
    a rotary door combined with the connecting bracket, a concave portion being formed on the rotary door;
    a sliding bracket installed on a side of the connecting bracket; and
    a sliding button slidably passing through the sliding track and disposed on another side of the connecting bracket, the sliding button being connected to the sliding bracket, when the sliding button is located at a stopping position, the sliding button contacting against the rotary door and for constraining the rotary door from sliding relative to the cover in a first direction and the sliding button driving the sliding bracket to a position where the sliding bracket is stopped by the stopping portion for constraining the rotary door from pivoting relative to the cover, and when the sliding button is located at an unlocking position, the sliding button driving the sliding bracket to a position where the sliding bracket is not stopped by the stopping portion, and the rotary door is capable of sliding relative to the cover in the first direction for engaging the concave portion with the sliding button, so that the rotary door pivots in a first pivoting direction relative to the cover to partially expose the containing space, the cover being detachable from the housing by sliding in the first direction, and the cover and the rotary door being substantially co-planar when covering the containing space.

12. The electronic device of claim 11, wherein an L-shaped slot is formed on a side of the housing, a rotary constraining unit is disposed on a side of the rotary door and movably installed inside the L-shaped slot, the rotary door slides in a second direction opposite to the first direction relative to the connecting bracket, so that the rotary constraining unit contacts against an end portion of the L-shaped slot for constraining the rotary door from pivoting relative to the cover, and when the sliding button is located at the unlocking position, the rotary constraining unit moves in the first direction for engaging the concave portion with the sliding button, so that the rotary constraining unit moves to a corner portion of the L-shaped slot and the rotary door is capable of pivoting relative to the cover.

13. The electronic device of claim 11, wherein a protruding portion is formed on a side of the rotary door far away from the cover and for inserting into a groove on the housing, so as to constrain the rotary door from pivoting relative to the cover, as the rotary door sides relative to the connecting bracket in a second direction.

14. The electronic device of claim 11, wherein a guiding slot is formed on the connecting bracket, the door mechanism further comprises a pin, and an end of the pin is fixed on the rotary door and slidably disposed in the guiding slot, and the guiding slot is for guiding the pin to move in the first direction.

15. The electronic device of claim 11, wherein a plurality of first hemmed edges is spaced on a side of the cover facing to the connecting bracket, a plurality of second hemmed edges is spaced on a side of the connecting bracket facing to the cover, the plurality of first hemmed edges and the plurality of second hemmed edges are arranged alternately, and the door mechanism further comprising a shaft passing through a side opening and inserted into the plurality of first hemmed edges and the plurality of second hemmed edges, so that the rotary door pivots relative to the cover via the shaft.

16. The electronic device of claim 15, wherein a side protruding portion is disposed on each of two sides of the rotary door, the side protruding portion covers the shaft and the corresponding side opening as the rotary door pivots relative to the cover.

17. The electronic device of claim 11, wherein the cover comprises a rotary stopping portion for constraining the rotary door from rotating in a second pivoting direction opposite to the first pivoting direction.

18. The electronic device of claim 11, wherein the sliding button further comprises a wall for contacting against the rotary door so as to constrain the rotary door from moving in the first direction, when the sliding button is located at the stopping position.

19. The electronic device of claim 11, wherein a guiding inclined surface is formed on an end of the sliding bracket for guiding the sliding bracket to engage with the stopping portion.

20. The electronic device of claim 11, wherein at least one protrusion is formed on the sliding track of the connecting bracket for pushing the sliding button as the sliding button slides in the sliding track.

* * * * *